US008197898B2

(12) United States Patent
Leusink

(10) Patent No.: US 8,197,898 B2
(45) Date of Patent: Jun. 12, 2012

(54) METHOD AND SYSTEM FOR DEPOSITING A LAYER FROM LIGHT-INDUCED VAPORIZATION OF A SOLID PRECURSOR

(75) Inventor: Gerrit J. Leusink, Saltpoint, NY (US)

(73) Assignee: Tokyo Electron Limited, Tokyo (JP)

( * ) Notice: Subject to any disclaimer, the term of this patent is extended or adjusted under 35 U.S.C. 154(b) by 1627 days.

(21) Appl. No.: 11/092,101

(22) Filed: Mar. 29, 2005

(65) Prior Publication Data
US 2006/0228494 A1   Oct. 12, 2006

(51) Int. Cl.
C23C 16/00 (2006.01)
B01J 19/08 (2006.01)
G21H 1/00 (2006.01)
G21H 5/00 (2006.01)
H01F 45/00 (2006.01)
B05D 3/00 (2006.01)

(52) U.S. Cl. ........... 427/248.1; 427/255.23; 427/255.28; 427/457; 427/561

(58) Field of Classification Search .............. 427/248.1, 427/255.23, 255.28, 457, 561
See application file for complete search history.

(56) References Cited

U.S. PATENT DOCUMENTS

| 4,514,437 | A | * | 4/1985 | Nath | 427/566 |
|---|---|---|---|---|---|
| 5,108,983 | A | | 4/1992 | Lackey, Jr. et al. | 505/1 |
| 5,312,509 | A | | 5/1994 | Eschbach | 156/345 |
| 5,553,395 | A | | 9/1996 | Wen et al. | 34/359 |
| 5,674,574 | A | * | 10/1997 | Atwell et al. | 427/561 |
| 5,810,930 | A | * | 9/1998 | Eom et al. | 118/719 |
| 5,904,771 | A | | 5/1999 | Tasaki et al. | 117/105 |
| 6,114,557 | A | | 9/2000 | Uhlenbrock et al. | |
| 6,136,725 | A | * | 10/2000 | Loan et al. | 438/758 |
| 6,303,809 | B1 | | 10/2001 | Chi et al. | 556/136 |
| 6,413,860 | B1 | | 7/2002 | Hautala et al. | |
| 6,428,623 | B2 | | 8/2002 | Westmoreland et al. | 118/715 |
| 6,440,495 | B1 | | 8/2002 | Wade et al. | 427/250 |
| 6,605,735 | B2 | | 8/2003 | Kawano et al. | 556/136 |
| 6,660,328 | B1 | | 12/2003 | Dahmen et al. | 427/248.1 |
| 6,701,066 | B2 | | 3/2004 | Sandhu | 392/386 |
| 6,713,373 | B1 | | 3/2004 | Omstead | 438/608 |
| 6,718,126 | B2 | | 4/2004 | Lei | 392/388 |
| 6,740,586 | B1 | | 5/2004 | Wang et al. | 438/680 |
| 6,797,337 | B2 | | 9/2004 | Dando et al. | 427/561 |

(Continued)

FOREIGN PATENT DOCUMENTS
DE   196 20 634 A1   11/1997
(Continued)

OTHER PUBLICATIONS

European Patent Office, International Search Report from Corresponding PCT Application No. PCT/US2006/007147, Dated Aug. 4, 2006 (4 pages).

Primary Examiner — Kelly M Gambetta
(74) Attorney, Agent, or Firm — Wood, Herron & Evans, LLP

(57) ABSTRACT

A method and system for depositing a layer from a vaporized solid precursor. The method includes providing a substrate in a process chamber of a deposition system, forming a precursor vapor by light-induced vaporization of a solid precursor, and exposing the substrate to a process gas containing the precursor vapor to deposit a layer including at least one element from the precursor vapor on the substrate.

16 Claims, 3 Drawing Sheets

U.S. PATENT DOCUMENTS

| | | |
|---|---|---|
| 2003/0129306 A1 | 7/2003 | Wade et al. |
| 2004/0083963 A1* | 5/2004 | Dando et al. .................. 118/715 |
| 2004/0105934 A1 | 6/2004 | Chang et al. |
| 2004/0247779 A1 | 12/2004 | Selvamanickam et al. |
| 2005/0019026 A1* | 1/2005 | Wang et al. ................... 392/389 |
| 2005/0064207 A1 | 3/2005 | Senzaki et al. |
| 2005/0081882 A1 | 4/2005 | Greer et al. ................... 134/1.1 |
| 2005/0110142 A1 | 5/2005 | Lane et al. .................... 257/751 |
| 2005/0186341 A1 | 8/2005 | Hendrix et al. ............ 427/248.1 |

FOREIGN PATENT DOCUMENTS

| | | |
|---|---|---|
| EP | 0 714 999 | 6/1996 |
| WO | WO2004/010463 | 1/2004 |

\* cited by examiner

METHOD AND SYSTEM FOR DEPOSITING A LAYER FROM LIGHT-INDUCED VAPORIZATION OF A SOLID PRECURSOR

FIELD OF THE INVENTION

The present invention relates to semiconductor processing, and more particularly, to a deposition system and method for depositing a layer on a substrate from a vaporized solid precursor.

BACKGROUND OF THE INVENTION

Manufacturing of integrated circuits includes deposition of various materials onto patterned substrates, such as silicon wafers. These materials include metal and metal-containing layers, such as diffusion barriers/liners to prevent diffusion of copper (Cu) from copper-containing conducting layers into dielectric materials and seed layers that promote adhesion and growth of the Cu layers onto the substrate. As the minimum feature sizes of patterned substrates continues to shrink, deposition processes are required that can provide advanced layers on high-aspect ratio structures at sufficiently low temperatures.

Chemical vapor deposition (CVD) has seen increasing use for preparation of coatings and thin layers in semiconductor wafer processing. CVD is a favored deposition method in many respects; for example, because of its ability to provide highly conformal and high quality layers at relatively fast processing times. Further, CVD is beneficial in depositing layers on substrates of irregular shapes, including the provision of highly conformal layers despite the presence of deep contacts and other high aspect-ratio features. In general, CVD techniques involve the delivery of gaseous precursors (reactants) to the surface of a substrate where chemical reactions take place under temperature and pressure conditions that are favorable to the thermodynamics of the desired reaction. The type and composition of layers that can be formed using CVD may be affected by the ability to deliver the reactants or reactant precursors to the surface of the substrate.

In order for the device manufacturing process to be practical, the deposition processes must be carried out in a reasonable amount of time. This requirement can necessitate efficient delivery of a precursor containing a metal element or a non-metal element to a process chamber containing the substrate(s) to be processed. A common problem encountered in the deposition of materials by CVD techniques is a low deposition rate onto a substrate because the vapor pressure of the solid precursor is low and because of the transport issues associated with such low vapor pressures, thereby making the deposition process impractical. The low vapor pressure can limit the flow of the precursor through gas lines to the process chamber of the deposition system. In addition, many solid precursors can partially or completely dissociate prematurely in the precursor vaporization system upon heating, thereby limiting the temperature to which the precursors can be heated and the precursor vapor pressures.

For these and other reasons, it is desirable to provide apparatus and methods for efficiently delivering a precursor to a process chamber that overcome the various problems associated with conventional CVD deposition systems.

SUMMARY OF THE INVENTION

The present invention provides a method and system for depositing a layer on a substrate from a light-induced vaporization of a solid precursor. The precursor can be a metal-containing precursor or a precursor containing a non-metal and no metal. According to an embodiment of the invention, the layer can be deposited in a CVD process, an atomic layer deposition (ALD) process, or a sequential flow deposition (SFD) process.

According to an embodiment of the invention, the method includes providing a substrate in a process chamber of a deposition system, forming a precursor vapor by light-induced vaporization of a solid precursor, and exposing the substrate to a process gas containing the precursor vapor to deposit a layer including at least one element from the precursor vapor on the substrate.

According to an embodiment of the invention, the deposition system includes a process chamber, a substrate holder provided within the process chamber to support a substrate, a precursor vaporization system coupled in fluid communication with the process chamber, and configured to hold a solid precursor. The precursor vaporization system further comprises a light transmissive window and a light source supplying light through the light transmissive window effective to vaporize the solid precursor and form a precursor vapor communicated to the process chamber to deposit a layer including at least an element from the precursor vapor on the substrate.

The methods and apparatus of the invention advantageously eliminate or reduce difficulties observed in conventional CVD, ALD, and SFD deposition systems associated with low vapor pressures of the solid precursor and the transport issues associated with these low vapor pressures. The invention also advantageously provides a precursor vaporization system for a deposition system and deposition methods that permit many solid precursors to be vaporized without causing partial or complete dissociation as occurs in conventional precursor vaporization systems.

These and other advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

In the following description, in order to facilitate a thorough understanding of the invention and for purposes of explanation and not limitation, specific details are set forth, such as a particular geometry of the deposition system and descriptions of various components of the deposition system. However, it should be understood that the invention may be practiced in other embodiments that depart from these specific details.

The invention relates to a method for vaporizing a solid precursor and depositing a layer on a substrate. As those skilled in the art will readily recognize, vaporizing may include sequentially changing a precursor from a solid phase to a liquid phase to a vapor phase, but vaporizing may also include sublimation in which the precursor changes directly from a solid phase to a vapor phase.

Figure 1:
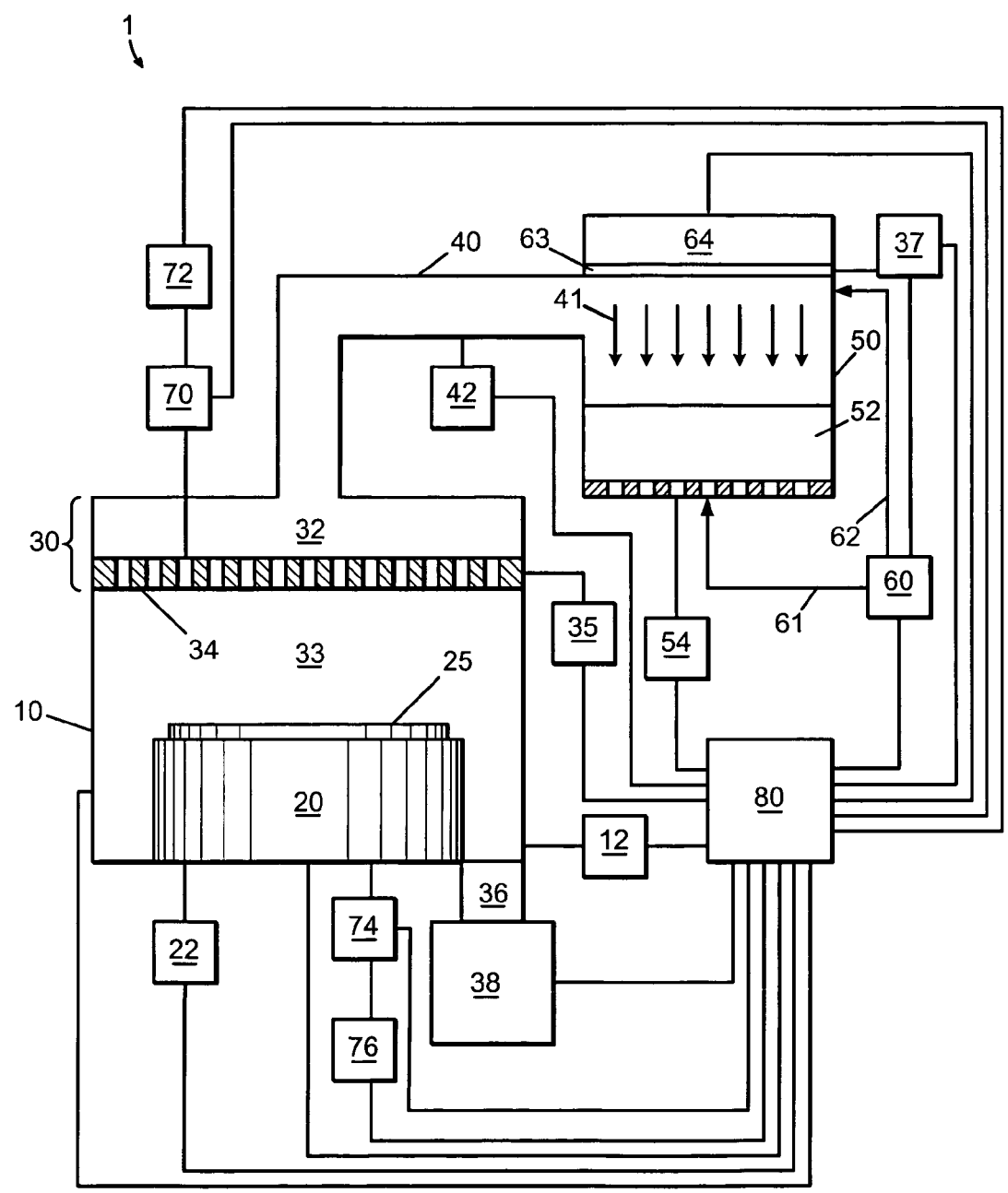
FIG. 1 depicts a schematic view of a deposition system according to an embodiment of the invention.

Referring now to the drawings, wherein like reference numerals designate identical or corresponding features throughout the several views, FIG. 1 depicts a deposition system 1 for depositing a layer on a substrate from a solid precursor according to one embodiment of the invention. The deposition system 1 includes a process chamber 10 having a substrate holder 20 configured to support a substrate 25, upon which the layer is formed. The process chamber 10 is coupled to a precursor vaporization system 50 via a vapor precursor delivery system 40. The process chamber 10 is further coupled to a vacuum pumping system 38 through a duct 36, wherein the pumping system 38 is configured to evacuate the process chamber 10, the vapor precursor delivery system 40, and the precursor vaporization system 50 to a pressure suitable for forming the layer on the substrate 25 and for vaporizing the precursor 52 in the precursor vaporization system 50.

The precursor vaporization system 50 is configured to hold a solid precursor 52 and to form precursor vapor by light-induced vaporization of the precursor 52. The precursor vapor is then flowed to the process chamber 10 via the vapor precursor delivery system 40. The precursor vaporization system 50 contains a light source 64 and a light transmissive window 63 configured for exposing the precursor 52 to ultra-violet and/or visible light 41 from the light source 64 effective to vaporize the precursor 52. The light transmissive window 63 can be configured to be easily replaced with a clean window in the event of material buildup on the window 63. The light transmissive window 63 is coupled to a window temperature control system 37 configured for controlling the temperature of the window 63. Furthermore, the precursor vaporization system 50 is coupled to a precursor temperature control system 54 configured to control the temperature of the precursor 52 by heating or cooling the precursor 52.

A gas supply system 60 is coupled to the precursor vaporization system 50, and is configured to supply, for instance, a carrier gas beneath the precursor 52 via feed line 61, or over the precursor 52 via feed line 62. The carrier gas can include, for example, an inert gas, such as $N_2$ or a noble gas (i.e., He, Ne, Ar, Kr, or Xe). According to an embodiment of the invention, the carrier gas can contain a carbon monoxide (CO) gas if the precursor is carbonyl-based. According to an embodiment of the invention, the feed line 62 can be configured for flowing a purge gas beneath the light transmissive window 63 in order to prevent or at the least reduce condensation or decomposition of the precursor vapor onto the light transmissive window 63. The purge gas can also be supplied evenly and uniformly into the precursor vaporization system 50 from the feed line 62. Although not shown, the feed line 62 may include multiple gas lines that can be circumferentially arranged about the precursor vaporization system 50, but this is not required for the invention. Although not shown, the gas supply system 60 can comprise at least one gas source, one or more control valves, one or more filters, and one or more mass flow controllers. For instance, the flow rate of the carrier gas can be between about 0.1 standard cubic centimeters per minute (sccm) and about 1000 sccm. Alternatively, the flow rate of the carrier gas can be between about 10 sccm and about 500 sccm. Still alternatively, the flow rate of the carrier gas can be between about 50 sccm and about 200 sccm.

The gas supply system 60 can be further configured to provide a cleaning gas to remove material deposits from the light transmissive window 63. The material deposits can be formed during the light-induced vaporization of the precursor 52 and can include condensed and/or decomposed precursor vapor. The window 83 may be cleaned as required using the cleaning gas. The specific type of cleaning gas that may be used depends on the type of precursor. Exemplary cleaning gases include fluorine-containing gases like $NF_3$, $XeF_2$, $ClF_3$, and $F_2$.

Downstream from the precursor vaporization system 50, the process gas containing the precursor vapor flows through the vapor precursor delivery system 40 and enters the process chamber 10 via a vapor distribution system 30 coupled thereto. The vapor precursor delivery system 40 can be coupled to a vapor line temperature control system 42 in order to control the vapor line temperature and prevent decomposition of the precursor vapor as well as condensation of the precursor vapor.

The vapor distribution system 30, which is coupled to the process chamber 10, contains a vapor distribution plenum 32 within which the vapor disperses before passing through a vapor distribution plate 34 and entering a processing zone 33 in process chamber 10 generally above the substrate 25. In addition, the vapor distribution plate 34 can be coupled to a distribution plate temperature control system 35 configured to control the temperature of the vapor distribution plate 34.

Once the process gas containing the precursor vapor enters the processing zone 33 of process chamber 10, the precursor vapor thermally decomposes upon adsorption at the substrate surface due to the elevated temperature of the substrate 25, and a layer including at least one element from the precursor vapor is formed on the substrate 25. The substrate holder 20 is configured to elevate the temperature of the substrate 25 because the substrate holder 20 is coupled to a substrate temperature control system 22. For example, the substrate temperature control system 22 can be configured to elevate the temperature of the substrate 25 up to approximately 500° C., although the invention is not so limited. Additionally, the process chamber 10 can be coupled to a chamber temperature control system 12 configured to control the temperature of the chamber walls.

According to an embodiment of the invention, the deposition system 1 can be configured for performing a plasma-enhanced chemical vapor deposition process where a plasma is formed in the processing zone 33. The plasma can be formed by plasma-exciting the process gas by a plasma source and exposing the substrate 25 to the plasma-excited process gas. The plasma can be generated by a RF plasma source including the vapor distribution plate 34, which operates as an upper electrode, and a RF generator 72 electrically connected through an impedance match network 70 with the vapor distribution plate 34. A frequency for the application of RF power from RF generator 72 to the vapor distribution plate 34 can range from 10 MHz to 200 MHz and, for example, can be 60 MHz. The RF power applied to the vapor distribution plate 34 can be between about 500 Watts (W) and about 2200 W.

The RF plasma source further includes a RF source for optionally applying RF power to the substrate holder 20 to bias the substrate 25. The RF source contains a RF generator 76 and an impedance match network 74 that serves to maximize the transfer of RF power to plasma to the processing region 33 by minimizing the reflected power. Match network topologies (e.g., L-type, π-type, T-type) and automatic control methods are known in the art. The RF power applied to the substrate holder 20 can be between about 0 W and about 1000 W. A frequency for the application of power to the substrate holder 20 can range from 0.1 MHz to 30 MHz and can be 2 MHz. In an alternate embodiment, RF power can be applied to the substrate holder 20 at multiple frequencies.

Still referring the FIG. 1, the deposition system 1 can further include a controller 80 configured to control the operation of the deposition system 1. The controller 80 is coupled to, and exchanges information with, the process chamber 10, the substrate holder 20, the substrate temperature control system 22, the chamber temperature control system 12, the vacuum pumping system 38, the distribution plate temperature control system 35, the vapor line temperature control system 42, the precursor temperature control system 54, the gas supply system 60, the light source 64, and the window temperature control system 37. Moreover, the controller 80 is coupled to the RF generators 72 and 76 and the impedance match networks 70 and 74 to control the application of RF power to the vapor distribution plate 34 and the substrate holder 20, respectively.

The controller 80 includes a microprocessor, a memory, and a digital I/O port capable of generating control voltages sufficient to communicate and activate inputs of the deposition system 1 as well as monitor outputs from the deposition system 1. In the vacuum pumping system 38, the controller 80 is coupled to, and exchanges information with, an automatic pressure controller (not shown) for controlling the pressure in the process chamber 10. A program stored in the memory is utilized to control the aforementioned components of deposition system 1 according to a stored process recipe. One example of processing system controller 80 is a DELL PRECISION WORKSTATION 610™, available from Dell Corporation, Dallas, Tex. The controller 80 may also be implemented as a general-purpose computer, digital signal process, etc.

The controller 80 may be locally located relative to the deposition system 1, or it may be remotely located relative to the deposition system 1 via an internet or intranet. Thus, the controller 80 can exchange data with the deposition system 1 using at least one of a direct connection, an intranet, or the internet. The controller 80 may be coupled to an intranet at a customer site (i.e., a device maker, etc.), or coupled to an intranet at a vendor site (i.e., an equipment manufacturer). Furthermore, another computer (i.e., controller, server, etc.) can access controller 80 to exchange data via at least one of a direct connection, an intranet, or the internet.

The controller 80 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 80 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 80, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 60 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 80.

Figure 2:
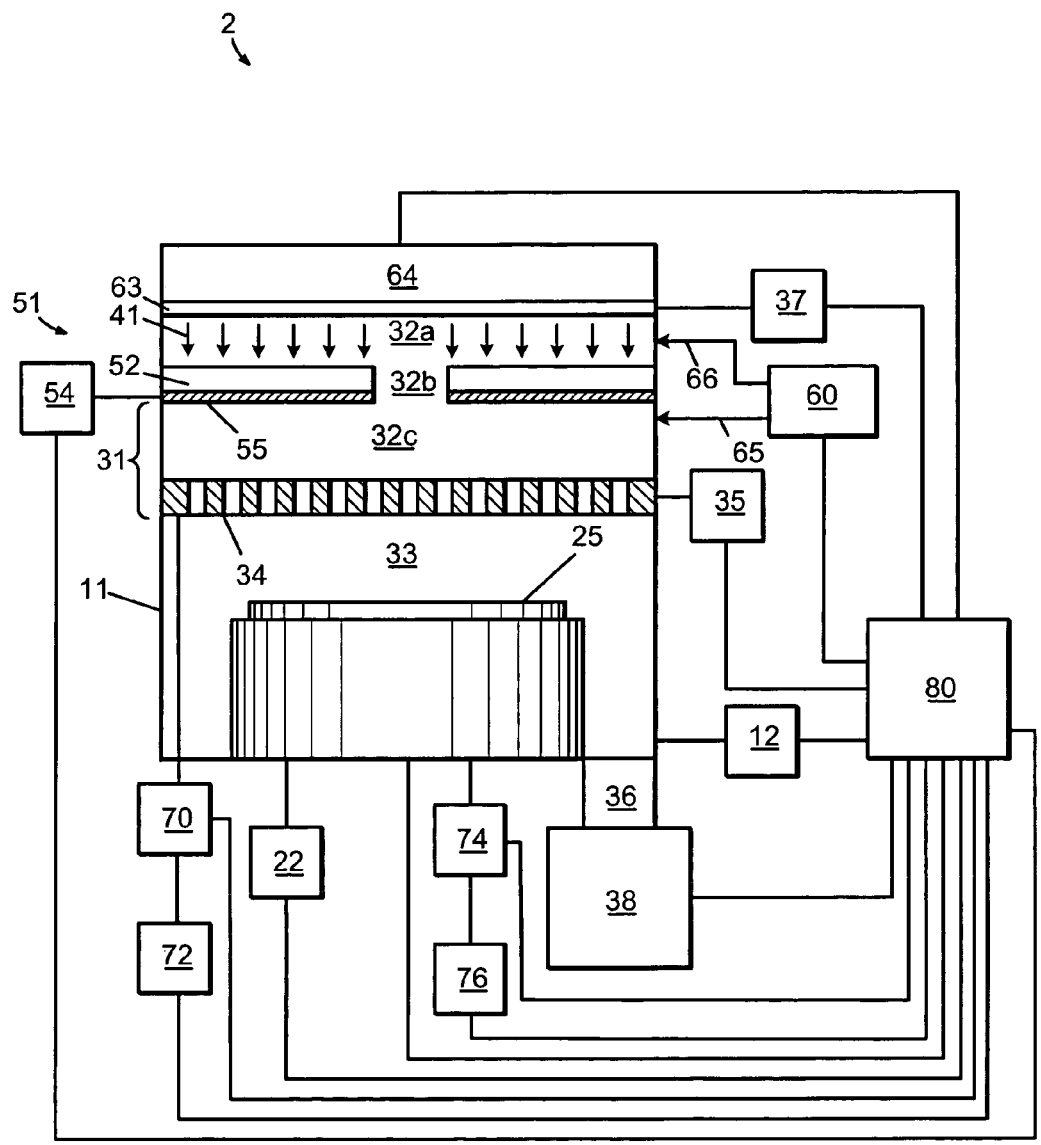
FIG. 2 depicts a schematic view of a deposition system according to another embodiment of the invention.

FIG. 2 depicts a deposition system 2 for depositing a layer on a substrate from a solid precursor according to another embodiment of the invention. A process chamber 11 is coupled to a precursor vaporization system 51 containing a light source 64 and a light transmissive window 63 configured for exposing a solid precursor 52 to ultra-violet and/or visible light 41 to vaporize the precursor 52. A precursor holder 55 is configured to store the precursor 52 and the precursor temperature control system 54 is configured to control the temperature of the precursor holder 55 and the precursor 52. The precursor vaporization system 51 contains a precursor vaporization zone 32a coupled to a vapor distribution plenum 32c via an opening 32b in the precursor holder 55. The precursor vapor flows from the precursor vaporization zone 32a through the opening 32b and disperses within the vapor distribution plenum 32c of the vapor distribution system 31 before passing through the vapor distribution plate 34 and entering the processing zone 33 above the substrate 25.

Although the precursor holder 55 in FIG. 2 is shown having only one opening 32b, this is not required for the invention, as alternatively the precursor holder 55 may have a plurality of openings defined between the precursor vaporization zone 32a and the vapor distribution plenum 32c.

Gas supply system 60 is coupled to the precursor vaporization system 51, and is configured to, for instance, supply carrier gas in the vaporization zone 32a via feed line 66, and, or in the alternative, in the vapor distribution plenum 32c via feed line 65. As described above, the carrier gas can include, for example, an inert gas, such as $N_2$, or a noble gas (i.e., He, Ne, Ar, Kr, or Xe), and may contain a CO gas. A purge gas can be supplied evenly and uniformly into the precursor vaporization system 51 from the feed line 62. Although not shown, the feed lines 65 and 66 may include multiple gas lines that can be circumferentially arranged about the precursor vaporization system 51, but this is not required for the invention. As described above, the gas supply system 60 can be further configured to provide a cleaning gas via the feed line 62 to remove material deposits from the light transmissive window 63.

Figure 3:
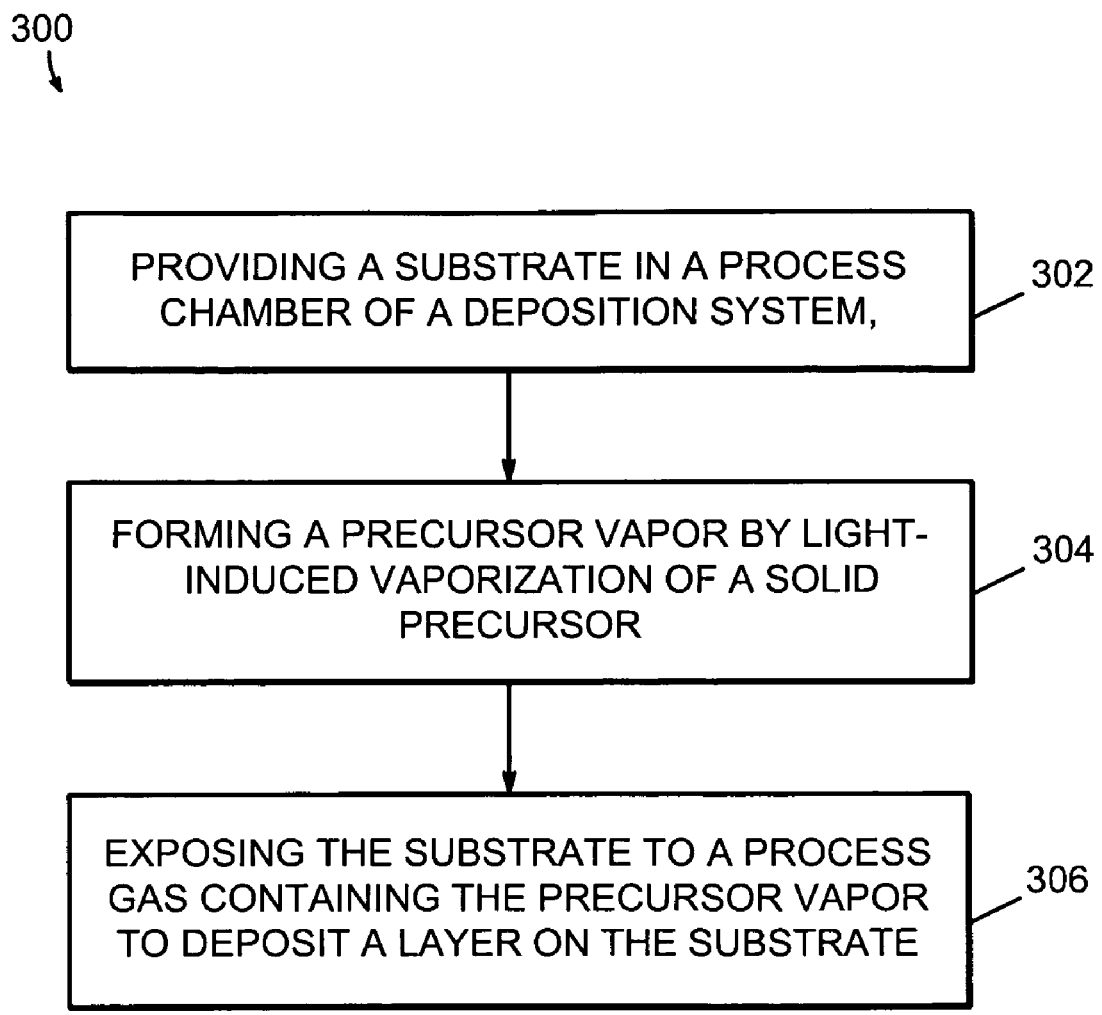
FIG. 3 is a flow diagram for delivering a solid precursor according to an embodiment of the invention.

FIG. 3 is a flow diagram showing a method for delivering a solid precursor to a process chamber according to an embodiment of the invention. The method 300 includes, at block 302, providing a substrate in a process chamber of a deposition system. For example, the deposition system can include any of the deposition systems described above in FIGS. 1 and 2, but this is not required for the invention, as other deposition systems may be used. The substrate can be, for example, a Si substrate. A Si substrate can be of n- or p-type, depending on the type of device being formed. The substrate can be of any size, for example a 200 mm substrate, a 300 mm substrate, or an even larger substrate.

At block 304, a precursor vapor is formed by light-induced vaporization of a solid precursor. In general, the desired frequency of the light to vaporize a solid precursor can depend on the type of precursor. As those skilled in the art will appreciate, if the energy of the light is too high (i.e., wavelength too low), premature dissociation of the precursor can take place in the precursor vaporization system instead of the desired vaporization of the precursor. In addition to exposing the solid precursor to UV or visible light, the solid precursor can be heated or cooled to maintain the solid precursor at a predetermined temperature.

As those skilled in the art will appreciate, embodiments of the invention can reduce or eliminate the need to maintain a solid precursor at a high temperature in order to provide a desired supply of the precursor vapor for a chemical vapor deposition process. Thus, the solid precursor may be maintained at temperature lower than what is needed for conventional thermal vaporization (in the absence of light-induced vaporization). This reduces premature decomposition and possible recrystallization of the precursor in the precursor vaporization system while providing the desired supply of the precursor.

According to one embodiment of the invention, the solid precursor can be vaporized using multi-frequency ultraviolet (UV), visible light, or both. Examples of light sources that can provide multi-frequency UV and/or visible light include a mercury (Hg) lamp (200 nm-450 nm) and a tungsten (W) lamp (370 nm-700 nm), but the invention is not limited to these light sources as other light sources may be used.

According to another embodiment of the invention, the solid precursor can be vaporized using single-frequency (i.e., monochromatic) UV or visible light. Examples of single-frequency light sources include excimer lamps using active gases such as Xe (wavelength output=172 nm), KrCl (222 nm), KrF (248 nm), $F_2$ (157 nm), ArF (193 nm), XeBr (282 nm), XeCl (308 nm), and XeF (351 nm), but the invention is not limited to these light sources as other light sources may be used.

According to an embodiment of the invention, the light source can be a pulsed light source that emits light in brief pulses. Alternatively, the light source can be a continuous light source that emits a continuous beam of light (e.g., continuous emission mode of a laser). Pulsed light sources such as lasers are capable of providing pulse energy that is several times greater than the energy from continuous light sources. A pulsed light source can be operated with a desired duty cycle to provide intense light pulses to vaporize a solid precursor and form pulses of vaporized precursor. A pulsed light source can be used to provide a controlled light exposure time to vaporize the solid precursor and a low thermal budget (only localized heating of the solid precursor in the illuminated area of the solid precursor).

According to an embodiment of the invention, the solid precursor can be a metal-containing precursor, or a precursor that contains a non-metal (e.g., carbon, nitrogen, oxygen etc) and, hence, no metal element. As those skilled in the art will appreciate, the invention is not limited to the solid precursors mentioned below, as other solid precursors may be used without departing from the scope of the invention. According to an embodiment of the invention, the metal-containing precursor can be a tantalum-containing precursor, for example a tantalum halide ($TaX_5$, where X is F, Cl, Br, or I). According to another embodiment of the invention, the metal-containing precursor can be a tantalum amide, for example, $Ta(N(C_2H_5CH_3))_5$ (PEMAT), $Ta(N(CH_3)_2)_5$ (PDMAT), $Ta(N(C_2H_5)_2)_5$ (PDEAT), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$. According to another embodiment of the invention, the metal-containing precursor can be a titanium precursor, for example a titanium halide ($TiX_4$, where X is F, Cl, Br, or I). According to yet another embodiment of the invention, the metal-containing precursor can be a titanium amide, for example $Ti(N(C_2H_5CH_3))_4$ ((TEMAT), $Ti(N(CH_3))_4$ (TDMAT), or $Ti(C_2H_5)_2)_4$ (TDEAT).

According to an embodiment of the invention, the metal-containing precursor can be a metal carbonyl precursor. For instance, the metal carbonyl precursor can have the general formula $M_x(CO)_y$, and can comprise a tantalum carbonyl, a tungsten carbonyl, a nickel carbonyl, a molybdenum carbonyl, a cobalt carbonyl, a rhodium carbonyl, a rhenium carbonyl, a chromium carbonyl, a ruthenium carbonyl, an osmium carbonyl, or a combination of two thereof. These metal carbonyls include, but are not limited to, $Ta(CO)_5$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, $Os_3(CO)_{12}$, or a combination of two or more thereof.

At block 306, the substrate is exposed to the process gas containing the precursor vapor to deposit a layer on the substrate. The layer can be deposited by a chemical vapor deposition process (CVD), an atomic layer deposition process (ALD) where the layer is deposited at a thickness of approximately one atomic layer per exposure cycle, or a sequential flow deposition process (SFD) where the layer may be deposited at thickness of more than one atomic layer per exposure cycle. In ALD and SFD, precursors and various components of the layer can be alternately exposed to the substrate. According to an embodiment of the invention, the CVD process can be a thermal CVD process. Alternately, the CVD process can be a plasma-enhanced CVD process. According to an embodiment of the invention, the metal layer can be deposited at a substrate temperature between about 50° C. and about 600° C., although the invention is not so limited. Alternately, the substrate temperature can be between about 150° C. and about 300° C.

As would be appreciated by those skilled in the art, each of the steps or stages in the flowchart of FIG. 3 may encompass one or more separate steps and/or operations. Accordingly, the recitation of only three steps in blocks 302, 304, 306 should not be understood to limit the method of the present invention solely to three steps or stages. Moreover, each representative step or stage in blocks 302, 304, 306 should not be understood as limited to only a single process.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for depositing a layer on a substrate located in a deposition system having a process chamber with a light transmissive window, the method comprising:
    placing a solid precursor into a precursor holder within the process chamber;
    forming a precursor vapor in a precursor vaporization zone between the precursor holder and the light transmissive window by vaporizing the solid precursor with light transmitted through the light transmissive window;
    transporting the precursor vapor from the precursor vaporization zone to the substrate in the process chamber; and
    exposing the substrate in the process chamber to a process gas containing the precursor vapor to deposit a layer including at least one element from the precursor vapor on the substrate.

2. The method according to claim 1, wherein forming the precursor vapor comprises:
    exposing the solid precursor to light of multiple frequencies or light of a single frequency.

3. The method according to claim 1, wherein forming the precursor vapor comprises:
    exposing the solid precursor to UV light, visible light, or a combination thereof.

4. The method according to claim 1, wherein forming the precursor vapor comprises:
    exposing the solid precursor to light with wavelength between about 150 nm and about 700 nm.

5. The method according to claim 1, wherein forming the precursor vapor further comprises:
    heating or cooling the solid precursor.

6. The method according to claim 1, wherein transporting the precursor vapor further comprises:
    flowing a carrier gas over or through the solid precursor.

7. The method according to claim 6, wherein the carrier gas comprises an inert gas, a CO gas, or a combination thereof.

8. The method according to claim 7, wherein the inert gas comprises $N_2$ or a noble gas.

9. The method according to claim 1, wherein the solid precursor comprises a metal-containing precursor or a precursor containing a non-metal but no metal element.

10. The method according to claim 1, wherein the solid precursor comprises a tantalum halide, a tantalum amide, a titanium halide, a titanium amine, a tantalum carbonyl, a tungsten carbonyl, a nickel carbonyl, a molybdenum carbonyl, a cobalt carbonyl, a rhodium carbonyl, a rhenium carbonyl, a chromium carbonyl, a ruthenium carbonyl, an osmium carbonyl, or a combination of two or more thereof.

11. The method according to claim 1, wherein the at least one element comprises Ta, Ti, W, Ni, Mo, Co, Rh, Re, Cr, Ru, Os, or a combination of two or more thereof.

12. The method according to claim 1, wherein the layer is deposited in a thermal vapor deposition process, a plasma-enhanced vapor deposition process, an atomic layer deposition process, or a sequential flow deposition process.

13. The method according to claim 1, further comprising:
    flowing a cleaning gas across the light transmissive window to remove deposits from the light transmissive window.

14. The method according to claim 1, wherein the precursor holder forms a plenum between the precursor holder and a distribution plate in the process chamber such that during transporting, the precursor vapor passes through an opening into the plenum and through the distribution plate into contact with the substrate.

15. The method according to claim 1, further comprising:
    flowing a purge gas across the light transmissive window to substantially prevent condensation or decomposition of the precursor vapor onto the light transmissive window.

16. The method according to claim 1, wherein transporting the precursor vapor further comprises:
    transporting the precursor vapor through an opening in the precursor holder.

* * * * *